US007039667B1

(12) United States Patent
Awaka et al.

(10) Patent No.: US 7,039,667 B1
(45) Date of Patent: May 2, 2006

(54) 4-2 COMPRESSOR

(75) Inventors: Kaoru Awaka, Ibaraki (JP); Yutaka Toyonoh, Ibaraki (JP); Hiroshi Takahashi, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 702 days.

(21) Appl. No.: 09/960,348

(22) Filed: Sep. 24, 2001

Related U.S. Application Data

(60) Provisional application No. 60/269,309, filed on Feb. 16, 2001.

(51) Int. Cl.
*G06F 7/50* (2006.01)

(52) U.S. Cl. .................................... 708/702; 708/708

(58) Field of Classification Search ............... 708/629, 708/700, 702, 703, 704, 708, 709
See application file for complete search history.

(56) References Cited

U.S. PATENT DOCUMENTS

| 4,556,948 | A | * | 12/1985 | Mercy | ........................ | 708/625 |
| 5,818,747 | A | * | 10/1998 | Wong | ........................ | 708/702 |
| 6,308,195 | B1 | * | 10/2001 | Hirase et al. | ............... | 708/708 |
| 6,584,485 | B1 | * | 6/2003 | Aoki et al. | .................. | 708/708 |
| 6,615,229 | B1 | * | 9/2003 | Vijayrao et al. | ............ | 708/629 |

OTHER PUBLICATIONS

A 4.4 ns CMOS 54×54-b Multiplier Using Pass-Transistor Multiplexer, IEEE Journal of Solid-State Circuits, vol. 30, No. 3, Mar. 1995.

TWTXBB: A Low Latency, High Thoroughput Multiplier Architecture Using a New 4-2 Compressor, 7th International Conference on VLSI Design, Jan. 1994.
A 0.25- μm CMOS 0.9-V 100-MHz DSP Core, IEEE Journal of D-State Circuits, vol. 32 No. 1. Jan. 1997.
Design of high-speed low power 3-2 counter and 4-2 compressor for fast multipliers, Electronics Letters, vol. 34 No. 4, Feb. 19, 1998.

* cited by examiner

*Primary Examiner*—Chuong D. Ngo
(74) *Attorney, Agent, or Firm*—Robert D. Marshall, Jr.; W. James Brady, III; Frederick J. Telecky, Jr.

(57) ABSTRACT

A compressor of a multiplier according to an embodiment of the present invention includes a first compressor, in which the first compressor includes a first plurality of inputs. The first compressor also includes a summation output, a first carry bit output; and a first plurality of transistor paths connecting each of the first plurality of inputs to the summation output. The compressor also includes a successive compressor, in which the successive compressor includes a second plurality of inputs and a plurality of successive transistor paths connecting at least one of the first plurality of inputs to the first carry bit output and connecting the first carry bit output to at least one of the second plurality of inputs. In one embodiment of the present invention, a first compressor critical transistor stage path level within the first compressor is less than seven and a successive compressor critical transistor stage path level within the successive compressor is less than eight. In another embodiment of the present invention, a first compressor critical transistor stage path level within the first compressor is less than eight and a successive compressor critical transistor stage path level within the successive compressor is less than seven.

10 Claims, 10 Drawing Sheets

FIG. 7

| NUMBER OF 1 | INPUTS | | | | | I | | | II | | | III | | | IV | | | V | | | VI | | | VII | | | VIII | | | IX | | |
|---|---|---|---|---|---|---|---|---|---|---|---|---|---|---|---|---|---|---|---|---|---|---|---|---|---|---|---|---|---|---|---|---|
| | AI | BI | CI | DI | XI | XO | CO | SO | XO | CO | SO | XO | CO | SO | XO | CO | SO | XO | CO | SO | XO | CO | SO | XO | CO | SO | XO | CO | SO | XO | CO | SO |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 |
| 1 | 0 | 1 | 0 | 0 | 0 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 |
| 2 | 1 | 1 | 0 | 0 | 0 | 1 | 0 | 0 | 0 | 1 | 0 | 0 | 1 | 0 | 0 | 1 | 0 | 0 | 1 | 0 | 1 | 0 | 0 | 1 | 0 | 0 | 1 | 0 | 0 | 1 | 0 | 0 |
| 1 | 0 | 0 | 1 | 0 | 0 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 |
| 2 | 1 | 0 | 1 | 0 | 0 | 1 | 0 | 0 | 0 | 1 | 0 | 0 | 1 | 0 | 1 | 0 | 0 | 1 | 0 | 0 | 0 | 1 | 0 | 1 | 0 | 0 | 1 | 0 | 0 | 1 | 0 | 0 |
| 2 | 0 | 1 | 1 | 0 | 0 | 1 | 0 | 0 | 0 | 1 | 0 | 0 | 1 | 0 | 1 | 0 | 0 | 1 | 0 | 0 | 0 | 1 | 0 | 1 | 0 | 0 | 1 | 0 | 0 | 1 | 0 | 0 |
| 3 | 1 | 1 | 1 | 0 | 0 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 1 | 0 | 0 | 0 | 1 | 0 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 |
| 2 | 1 | 0 | 0 | 1 | 0 | 0 | 1 | 0 | 0 | 1 | 0 | 0 | 1 | 0 | 1 | 0 | 0 | 1 | 0 | 0 | 0 | 1 | 0 | 0 | 1 | 0 | 1 | 0 | 0 | 1 | 0 | 0 |
| 2 | 0 | 1 | 0 | 1 | 0 | 0 | 1 | 0 | 0 | 1 | 0 | 0 | 1 | 0 | 1 | 0 | 0 | 1 | 0 | 0 | 0 | 1 | 0 | 0 | 1 | 0 | 1 | 0 | 0 | 1 | 0 | 0 |
| 3 | 1 | 1 | 0 | 1 | 0 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 2 | 0 | 0 | 1 | 1 | 0 | 0 | 1 | 0 | 0 | 1 | 0 | 1 | 0 | 0 | 0 | 1 | 0 | 1 | 0 | 0 | 0 | 1 | 0 | 1 | 0 | 0 | 0 | 1 | 0 | 1 | 0 | 0 |
| 3 | 1 | 0 | 1 | 1 | 0 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 3 | 0 | 1 | 1 | 1 | 0 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 4 | 1 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 |
| 1 | 0 | 0 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 |
| 2 | 1 | 0 | 0 | 0 | 1 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 |
| 2 | 0 | 1 | 0 | 0 | 1 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 |
| 3 | 1 | 1 | 0 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 2 | 0 | 0 | 1 | 0 | 1 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 |
| 3 | 1 | 0 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 3 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 4 | 1 | 1 | 1 | 0 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 |
| 2 | 0 | 0 | 0 | 1 | 1 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 | 0 | 1 | 0 |
| 3 | 1 | 0 | 0 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 3 | 0 | 1 | 0 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 4 | 1 | 1 | 0 | 1 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 |
| 3 | 0 | 0 | 1 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 |
| 4 | 1 | 0 | 1 | 1 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 |
| 4 | 0 | 1 | 1 | 1 | 1 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 | 1 | 1 | 0 |
| 5 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

4-2 COMPRESSOR

The present application claims priority from U.S. Provisional Patent Application No. 60/269,309, filed Feb. 16, 2001, entitled "New 4-2 Compressor for fast multiplier with transfer-gate type exclusive or (nor) gates," the disclosure of which is incorporated herein by reference in its entirety.

BACKGROUND OF THE INVENTION

1. Field of the Invention

The invention relates generally to the field of multipliers. More specifically, the invention is directed towards a 4-2 compressor of a multiplier having transfer-gate type exclusive OR and exclusive NOR gates.

2. Description of Related Art

In general, digital signal processors (DSP's) may be equipped with a multiply-accumulate module for the execution of multiplication instructions, such as multiplying a multiplicand X by a multiplier Y. The speed of the multiply-accumulate module may affect the operation frequency of the DSP such that increasing the speed of the multiply-accumulate module also may increase the operation frequency of the DSP. Some known multiply-accumulate modules may include a multiplier, an adder for the multiplier, and a saturation module. In some known multiply-accumulate modules, the multiplier may account for about half of the delay in the critical path of the multiply-accumulate module. Consequently, increasing the speed of the multiplier substantially may increase the overall speed of the multiply-accumulate module.

Some known multipliers may include at least two (2) stages. In the first stage, partial products of each bit of multiplier Y may be generated. The number of partial products depends on the number of bits of multiplier Y. For example, when multiplier Y is a 32-bit multiplier, thirty-two partial products may be generated. Similarly, when multiplier Y is a 17-bit multiplier, seventeen partial products may be generated. Moreover, in order to multiply multiplicand X by multiplier Y, the partial products are summed. Consequently, as the number of partial products increases, the number of summation steps also increases. In order to reduce the number of summation steps, some known multipliers may employ one of the known Booth Algorithms, e.g., the secondary Booth algorithm. The Booth algorithm may rewrite or encode the bits of multiplier Y, such that the number of partial products may be reduced. For example, when the secondary Booth algorithm is employed, the number of partial products to be summed may be reduced by a factor of two.

In the second stage, some known multipliers may sum the partial products. Moreover, to sum the partial products, the multipliers may sum the partial products in a Wallace tree. Some known Wallace trees may comprise a plurality of full adders. Alternatively, other known Wallace trees may comprise a plurality of compressors, such as a plurality of 4-2 compressors and full adders. The 4-2 compressors may count the number of "1's" in their respective inputs. For example, referring to FIG. 1, a flow chart of a known 54-bit multiplier 100 is shown. Multiplier 100 may comprise a Booth encoding circuit 102, which may generate twenty-seven partial products, which may be inputted into a Wallace tree 104. Specifically, four bit products from four partial products and one carry bit input may be inputted into each 4-2 compressor 104a–104g. A bit product may be defined as any single bit in a partial product. Compressors 104a–104g may generate a plurality of output signals, which may be inputted into 4-2 compressors 104h–104j, respectively. The above-described summation process may descend to the bottom of Wallace tree 104, such that 4-2 compressor 104m may generate a final summation output and carry bit outputs.

The number of 4-2 compressors employed in Wallace tree 104 may depend on the number partial products generated by the Booth encoding circuit. In addition, each 4-2 compressor may receive five inputs. Each 4-2 compressor may generate three outputs, such as a summation output and two carry bit outputs. For example, referring to FIGS. 2–6, in some known 4-2 compressors, bit products from partial products Ai, Bi, Ci, and Di, along with carry bit Xi, may be inputted into the compressor, which may generate a summation output So, a first carry bit Co, and second carry bit Xo. As shown in FIG. 7, for any 4-2 compressor, there are nine possible truth table patterns. Moreover, using known techniques, these patterns may be converted, such that they may be expressed as a logical formula(s), and 4-2 compressors may be designed to implement such logical expressions. For example, summation output So may be logically expressed as So=((Bi⊕Ci)⊕Di)⊕(Ai⊕Xi), where ⊕ is the logic symbol for an exclusive OR (XOR) logic gate. Alternatively, summation output So may be logically expressed as So=((Bi⊕Ci)⊕(Di⊕Ai))⊕Xi. In addition, carry bit Co may be logically expressed as Co=((Ai⊕Xi)·((Bi⊕Ci)⊕Di))+$\overline{(Ai⊕Xi)}$·Ai, where · is the logic symbol for AND, + is the logic symbol for an OR gate, and where the line bar is the logical symbol for NOT. Alternatively, the carry bit Co may be logically expressed as Co=$\overline{((Bi⊕Ci)⊕(Di⊕Ai))}$·Xi+((Bi⊕Ci)⊕(Di⊕Ai))·Ai. Moreover, carry bit Xo may be expressed as Xo=(Bi⊕Ci)·Di+$\overline{(Bi⊕Ci)}$·Bi.

Each of the known compressors shown in FIGS. 2–6, is designed to implement the above-described logical expressions for So, Co, and Xo. For example, referring to FIG. 2, a 4-2 compressor 200 may employ pass transistor logic exclusive OR (XOR) gates and pass transistor logic exclusive NOT OR (XNOR) gates to implement the above-described logical expressions. The term "pass transistor logic XOR gate" may be defined as employing a circuit as shown in FIG. 8a to generate an XOR output. Similarly, the term "pass transistor logic XNOR gate" may be defined as employing a circuit as shown in FIG. 8b to generate an XNOR output. Moreover, 4-2 compressor 200 also may employ transfer gate logic XOR gates and transfer gate logic XNOR gates to implement the above-described logical expressions. The term "transfer gate logic XOR gate" may be defined as employing a circuit as shown in FIG. 9a to generate an XOR output. Similarly, the term "transfer gate logic XNOR gate" may be defined as employing a circuit as shown in FIG. 9b to generate an XNOR output. Compressor 200 may include logic stages 202, 204, 206, and 208, which may be XOR, or XNOR stages. Compressor 200 also may include a plurality of transistor paths between each of the inputs and each of the outputs. A path may be defined as the electrical route over which a particular input signal must travel in order to reach a particular output. For example, in order to reach output So, input signal Bi may flow through an inverter 210, a switch 212, such as a CMOS switch, a switch 215, an inverter 216, an inverter 218, a switch 220, and an inverter 222. Thus, for this particular path (A), input signal Bi flows through seven transistor gates, such that the "transistor stage level" for path (A) is seven. Moreover, input signal Bi also flows through logic stages 202, 204, and 208, such that the "logic stage level" for path (A) is three. However, in order to reach output So, input signal Bi also may flow through a switch 230, switch 214, inverter 216, inverter 218, switch 220, and inverter 222. Thus for this particular path (B), although the logic stage number also is three, input signal Bi only flows through six transistor gates, such that the transistor stage level for path (B) is six. However, each of the inputs Ai, Bi, Ci, Di, and Xi may have a path or multiple paths to at least one of the outputs.

A first compressor "critical transistor stage path" may be defined as the path having the greatest transistor stage level between an input and an output within first compressor 200. Similarly, a first compressor "critical logic stage path" may be defined as the path having the greatest logic stage level between an input and an output within first compressor 200. Decreasing the first compressor critical transistor stage path level may increase the speed of the multiplier. Similarly, decreasing the first compressor critical logic stage path level also may increase the speed of the multiplier. However, each 4-2 compressor may have a plurality of first compressor critical transistor stage paths and a plurality of first compressor critical logic stage paths, or alternatively, may have a single first compressor critical transistor stage path. For example, in compressor 200, path (A) is a first compressor critical transistor stage path and also is a first compressor critical logic stage path because for path (A), the transistor stage level is seven and the logic stage level is three, and no other paths between an input and an output have a greater transistor stage level or a greater logic stage level. Path (B) is not a first compressor critical transistor stage path because for path (B), the transistor stage level only is six, and as such, the transistor stage level for path (A) is greater than the transistor stage level for path (B). However, path (B) is a first compressor critical logic stage path because the logic stage level for path (B) is three, and as such, the logic stage level for path (B) is the same as the transistor stage level for path (A).

In addition, the first carry bit output Xo from an initial compressor 200 may be connected to the carry bit input Xi of a successive compressor 200 in the Wallace tree. Consequently, in addition to having at least one first compressor critical logic stage path and at least one first compressor critical transistor stage path, each compressor 200 also has at least one successive compressor critical transistor stage path and at least one successive compressor critical logic stage path. For example, in compressor 200, carry bit output Xo may be defined by inputs Bi, Ci, and Di. Input signal Bi may flow through inputs 210, switch 212, a switch 224, and an inverter 226. The first carry bit output Xo of first compressor 200 then may be connected to the carry bit input of successive compressor 200, such that carry bit input Xi may help generate summation output So and carry bit output Co. For example, carry bit output Xo may flow through a switch 228, a switch 232, and inverter 222. This successive path (C) from Bi and Xo of first compressor 200 to Xi and So of successive compressor 200 has a transistor path level of seven. In addition, successive path (C) flows through stages 202 and 204 of first compressor 200 and stages 206 and 208 of successive compressor 200. Consequently, successive path (C) has a logic stage level of four. Similarly, input signal Ci may flow through switch 212, switch 224, and inverter 226. The first carry bit output Xo of first compressor 200 then may be connected to the carry bit input of successive compressor 200, such that carry bit input Xi may help generate summation output So. For example, carry bit output Xo may flow through switch 228, switch 232, and inverter 222. This successive path (D) from Ci and Xo of first compressor 200 to Xi and So of successive compressor 200 has a transistor path level of six. In addition, successive path (D) flows through stages 202 and 204 of first compressor 200 and stages 206 and 208 of successive compressor 200. Consequently, successive path (D) also has a logic stage level of four.

A successive compressor "critical transistor stage path" may be defined as the path having the greatest transistor stage level from one of the inputs of first compressor 200 to first compressor 200 carry bit output Xo and further to successive compressor 200 summation output So or carry bit output Co. Similarly, a successive compressor "critical logic stage path" may be defined as the path having the greatest logic stage level from one of the inputs of first compressor 200 to first compressor 200 carry bit output Xo and further to successive compressor 200 summation output So or carry bit output Co. Decreasing the successive compressor critical transistor stage path level may increase the speed of the multiplier. Similarly, decreasing the successive compressor critical logic stage path level also may increase the speed of the multiplier. However, each 4-2 compressor may have a plurality of successive compressor critical transistor stage paths and a plurality of successive compressor critical logic stage paths, or alternatively, may have a single successive compressor critical transistor stage path. For example, in compressor 200, successive path (C) is a successive compressor critical transistor stage path and also is a successive compressor critical logic stage path because for successive path (C) the transistor stage level is seven and the logic stage level is four. Successive path (D) is not a successive compressor critical transistor stage path because for successive path (D) the transistor stage level only is six. However, successive path (D) is a successive compressor critical logic stage path because the logic stage level is four.

Consequently, for compressor 200, the first compressor critical transistor stage path level is seven, the successive compressor critical transistor stage path level is seven, the first compressor critical logic stage path level is three, and the successive compressor critical logic stage path level is four.

Referring to FIG. 3, another known 4-2 compressor 300 is shown. Compressor 300 may employ transfer gate logic XOR gates, as shown in FIG. 9a, and transfer gate logic XNOR gates, as shown in FIG. 9b, to implement the above-described logical expressions. Compressor 300 may include logic stages 302, 304, 306, and 308, which may be XOR or XNOR stages. In compressor 300, input signal Bi may flow through an inverter 310, a switch 312, a switch 314, an inverter 316, an inverter 318, a switch 320, and an inverter 322. Thus, for this particular path (E), the transistor stage level is seven. In addition, no other paths in compressor 300 have a transistor stage level which is greater than seven. Consequently, path (E) is a first compressor critical transistor stage path and the first compressor critical transistor stage path is seven. Path (E) also may flow through logic stages 302, 304, and 308. Thus, the logic stage level for path (E) is three. Moreover, path (E) also is a first compressor 300 critical logic stage path. Consequently, the first compressor critical logic stage path is three.

Input signal Ci may flow through an inverter 324, a switch 326, a switch 328, and an inverter 330. Moreover, when first carry bit output Xo is connected to carry bit input of a successive compressor 300, input signal Ci also flows through an inverter 332, a switch 334, a switch 337, and an inverter 338 to generate second carry bit output Co. Thus, for this particular successive path (F), the transistor stage level is eight. In addition, no other paths have a successive transistor stage level greater than eight, such that successive path (F) also is a successive compressor 300 critical transistor stage path. Consequently, the successive compressor critical transistor stage path is eight. Successive path (F) also may flow through logic stages 302, 304, 306, and 308. Thus, the logic stage level for successive path (F) is four. Moreover, successive path (F) also is a successive compressor 300 critical logic stage path. Consequently, the successive compressor critical logic stage path is four.

Consequently, for compressor 300, the first compressor critical transistor stage path level is seven, the successive compressor critical transistor stage path level is eight, the first compressor critical logic stage path level is three, and the successive compressor critical logic stage path level is four.

Referring to FIG. 4, another known 4-2 compressor 400 is shown. Compressor 400 may employ transfer gate logic XOR gates, as shown in FIG. 9a, and transfer gate logic XNOR gates, as shown in FIG. 9b, to implement the above-described logical expressions. Compressor 400 may include logic stages 402, 404, and 406, which may be XOR or XNOR stages. In compressor 400, input signal Bi may flow through an inverter 408, a switch 410, a switch 412, a switch 414, an inverter 416, and an inverter 418. Thus, for this particular path (G), the transistor stage level is six. In addition, no other paths have a transistor stage level greater than six, such that path (G) also is a first compressor 400 critical transistor stage path. Consequently, the first compressor critical transistor stage path is six. Path (G) also may flow through logic stages 402, 404, and 406. Thus, the logic stage level for path (G) is three. Moreover, path (G) also is a first compressor 400 critical logic stage path. Consequently, the first compressor critical logic stage path is three.

Input signal Bi also may flow through inverter 408, switch 410, a switch 420, an inverter 422 and an inverter 424. Moreover, when first carry bit output Xo is connected to carry bit input of a successive compressor 400, input signal Bi also flows through an inverter 426, switch 414, inverter 416, and inverter 418 to generate summation output So. Thus, for this particular successive path (H), the transistor stage level is nine. In addition, no other paths have a successive transistor stage level greater than nine, such that successive path (H) also is a successive compressor 400 critical transistor stage path. Consequently, the successive compressor critical transistor stage path is nine. Successive path (H) also may flow through logic stages 402, 404, and 406. Thus, the logic stage level for successive path (H) is three. Moreover, successive path (H) also is a successive compressor 400 critical logic stage path. Consequently, the successive compressor critical logic stage path is three.

Consequently, for compressor 400, the first compressor critical transistor stage path level is six, the successive compressor critical transistor stage path level is nine, the first compressor critical logic stage path level is three, and the successive compressor critical logic stage path level is three.

Referring to FIG. 5, another known 4-2 compressor 500 is shown. Compressor 500 may employ tri-state buffers to implement the above-described logical expressions, and may include logic stages 502, 504, and 506. Moreover for compressor 500, the first compressor critical transistor stage path level is eight, the successive compressor critical transistor stage path level is eight, the first compressor critical logic stage path level is three, and the successive compressor critical logic stage path level is three.

Referring to FIG. 6, another known 4-2 compressor 600 is shown. Compressor 600 may employ a different type of transfer gate logic XOR gates and transfer gate logic XNOR gates to implement the above-described logical expressions, and may include logic stages 602, 604, and 606. Moreover for compressor 600, the first compressor critical transistor stage path level is six, the successive compressor critical transistor stage path level is nine, the first compressor critical logic stage path level is three, and the successive compressor critical logic stage path level is three.

SUMMARY OF THE INVENTION

Therefore, a need has arisen for compressors that overcome these and other shortcomings of the related art. A technical advantage of the present invention is that the speed of the multiplier may be increased by reducing the first compressor critical transistor stage path level. A technical advantage of the present invention is that the speed of the multiplier may be increased by reducing the successive compressor critical transistor stage path level. Yet another technical advantage of the present invention is that the output of any inverter in the compressor only may drive either a gate or a source of any switch within the same logic stage as the inverter. Still a further technical advantage of the present invention is that a drain of a switch may not drive the source of another switch.

According to an embodiment of the present invention, a compressor of a multiplier is described. The compressor comprises a first compressor, in which the first compressor comprises a first plurality of inputs. The first compressor also comprises a summation output, a first carry bit output; and a first plurality of transistor paths connecting each of the first plurality of inputs to the summation output. The compressor also comprises a successive compressor, in which the successive compressor comprises a second plurality of inputs and a plurality of successive transistor paths connecting at least one of the first plurality of inputs to the first carry bit output and connecting the first carry bit output to at least one of the second plurality of inputs. In one embodiment of the present invention, a first compressor critical transistor stage path level within the first compressor is less than seven and a successive compressor critical transistor stage path level within the successive compressor is less than eight. In another embodiment of the present invention, a first compressor critical transistor stage path level within the first compressor is less than eight and a successive compressor critical transistor stage path level within the successive compressor is less than seven.

In yet another embodiment of the present invention, the first compressor further may comprise a second carry bit output and a second plurality of transistor paths connecting each of the first plurality of inputs to the second carry bit output. Moreover, each of said first plurality of transistor paths, each of the second plurality of transistor paths, and each of the plurality of successive transistor paths may comprise a plurality of switches and a plurality of inverters, which may form a plurality of logic stages for each of the first plurality of inputs.

In one embodiment, when one of the first plurality of inputs is connected to a source of one of the switches, the input is not connected to a gate of another of the switches, and when one of the first plurality of inputs is connected to a gate of one the switches, the input is not connected to a source of another of the switches. In another embodiment, a drain of each of the switches is not connected to a source of another of the switches. In yet another embodiment, when one of the inverters within one of the logic stages is connected to a source of one of the switches within the same logic stage as the inverter, the inverter is not connected to a gate of another of the switches within the same logic stage as the inverter, and when one of the inverters within one of the logic stages is connected to a gate of one of the switches within the same logic stage as the inverter, the inverter is not connected to a source of another of the switches within the same logic stage as the inverter.

Other features and advantages will be apparent to persons of ordinary skill in the art in view of the following detailed description of the invention and the accompanying drawings.

BRIEF DESCRIPTION OF THE DRAWINGS

For a more complete understanding of the present invention, needs satisfied thereby, and the features and advantages thereof, reference now is made to the following descriptions taken in connection with the accompanying drawings.

FIG. 7 is a truth table pattern for a 4-2 compressor.

DETAILED DESCRIPTION OF PREFERRED EMBODIMENTS

Preferred embodiments of the present invention and their advantages may be understood by referring to FIGS. 7 and 9–11, like numerals being used for like corresponding parts in the various drawings.

Figure 9A:
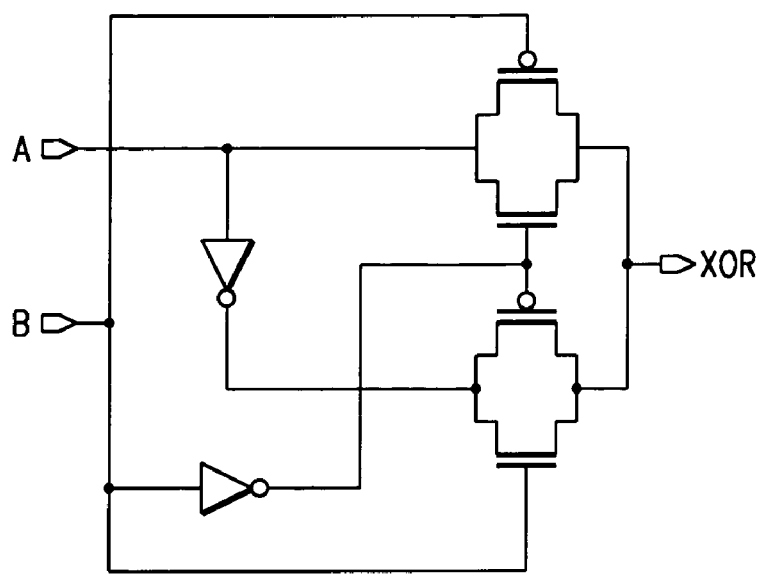
FIG. 9a is a schematic of a transfer gate logic XOR gate according to an embodiment of the present invention.
Figure 9B:
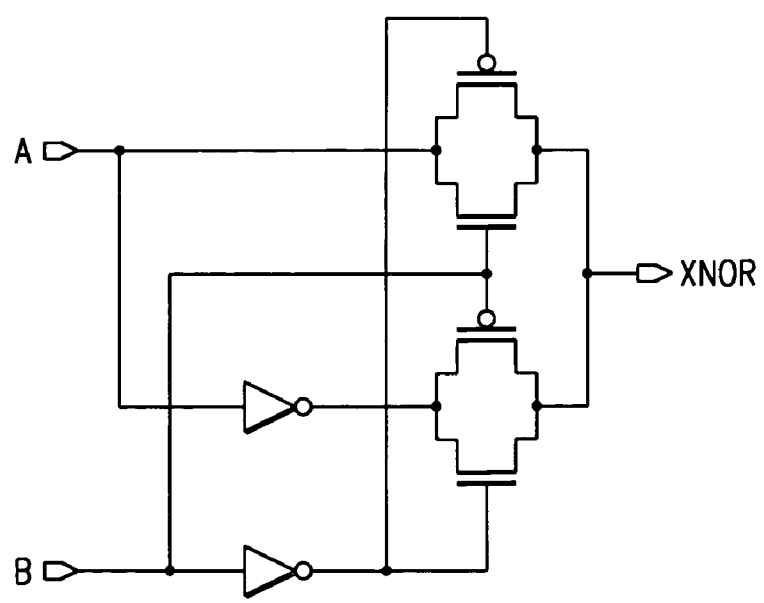
FIG. 9b is a schematic of a transfer gate logic XNOR gate according to an embodiment of the present invention.
Figure 10:
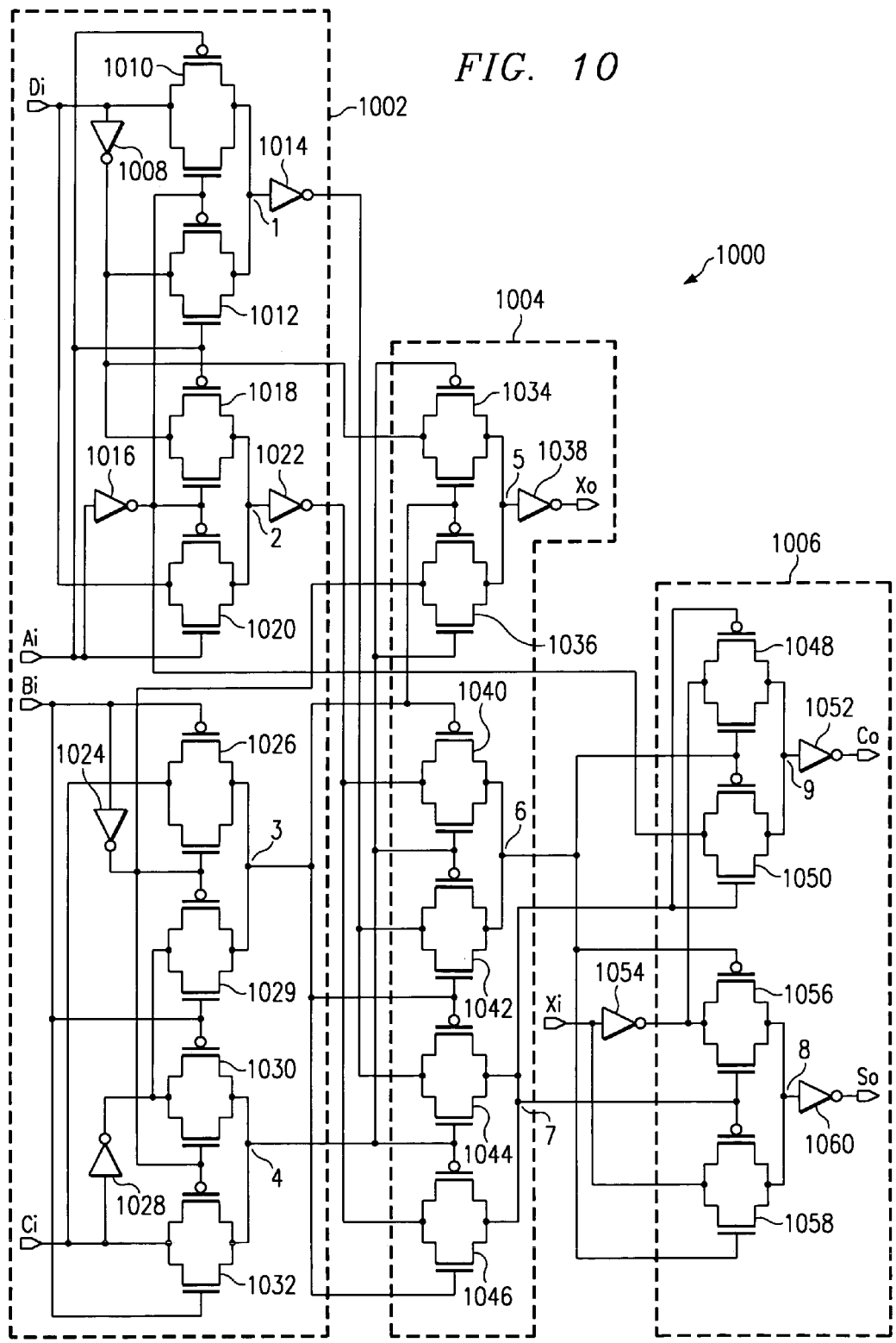
FIG. 10 is a schematic of a 4-2 compressor employing transfer gate logic XOR gates and transfer gate logic XNOR gates according to an embodiment of the present invention.

Referring to FIGS. 9 and 10, a 4-2 compressor 1000 employing transfer gate logic XOR gates and transfer gate logic XNOR gates is described. Compressor 1000 may comprise a plurality of inputs, Ai, Bi, Ci, and Di, which may be bit products from partial products to be summed from a Booth encoder circuit (not shown). A bit product may be defined as any single bit in a partial product. Compressor 1000 also may comprise a carry bit input Xi, a summation output So, a first carry bit output Xo, and a second carry bit output Co. Moreover, in one embodiment, first carry bit output Xo of a first compressor 1000 may be connected to carry bit input Xi of a successive compressor 1000 to generate summation output So and second carry bit output Co of the successive compressor 1000. Alternatively, first carry bit output Xo of first compressor 1000 may be connected to one of the plurality of inputs Ai–Di of successive compressor 1000.

Referring to FIG. 7, for any 4-2 compressor, there are nine possible truth table patterns. Moreover, using known techniques, these truth table patterns may be converted, such that they may be expressed as a logical formula(s), and 4-2 compressors may be designed to implement such logical expressions. In an embodiment of the present invention, compressor 1000 is designed to implement the following logical expressions:

$$So = ((Bi \oplus Ci) \oplus (Di \oplus Ai)) \oplus Xi; \quad (1)$$

$$Co = ((Bi \oplus Ci) \oplus (Di \oplus Ai)) \cdot Xi + \overline{((Bi \oplus Ci) \oplus (Di \oplus Ai))} \cdot Ai;$$
and $\quad (2)$ $$Xo = (Bi \oplus Ci) \cdot Di + \overline{(Bi \oplus Ci)} \cdot Bi. \quad (3)$$

In order to implement these logical expressions, input Di of compressor 1000 may be connected to a source of a switch 1010, such as a CMOS type switch. Input Di also may be connected to an inverter 1008, which may be connected to a source of a switch 1012. Input Ai of compressor 1000 may be connected to a n-gate of switch 1012 and a p-gate of switch 1010. Moreover, input Ai also may be connected to an inverter 1016, which may be connected to a n-gate of switch 1010 and a p-gate of switch 1012. The outputs or drains of switches 1010 and 1012 may be connected at a node 1, and the signal at node 1 may be expressed by the logical expression Di⊕Ai. The signal at node 1 may be connected to an inverter 1014, the output of which may be expressed by the logical expression $\overline{Di \oplus Ai}$. Moreover, such a configuration of inverter 1008, switch 1010, switch 1012, inverter 1014, and inverter 1016 may form a transfer gate logic XNOR gate, as shown in FIG. 9. In addition, such a transfer gate logic XNOR gate may form a first stage 1002 for inputs Ai and Di.

Input Di also may be connected to a source of a switch 1020, and further may be connected to inverter 1008, which may be connected to a source of a switch 1018. Input Ai of compressor 1000 may be connected to a n-gate of switch 1020 and a p-gate of switch 1018. Moreover, input Ai also may be connected to inverter 1016, which may be connected to a n-gate of switch 1018 and a p-gate of switch 1020. The outputs or drains of switches 1018 and 1020 may be connected at a node 2, and the signal at node 2 may be expressed by the logical expression $\overline{Di \oplus Ai}$. The signal at node 2 may be connected to an inverter 1022, the output of which may be expressed by the logical expression Di⊕Ai. Moreover, such a configuration of inverter 1008, inverter 1016, switch 1018, switch 1020, and inverter 1022, may form a transfer gate logic XOR gate. In addition, such a transfer gate logic XOR gate may form an alternative first stage 1002 for inputs Ai and Di.

Moreover, to implement the above-described logical expressions, input Ci of compressor 1000 may be connected to a source of a switch 1032. Input Ci also may be connected to an inverter 1028, which may be connected to a source of a switch 1030. Input Bi of compressor 1000 may be connected to a n-gate of switch 1032 and a p-gate of switch 1030. Moreover, input Bi also may be connected to an inverter 1024, which may be connected to a n-gate of switch 1030 and a p-gate of switch 1032. The outputs or drains of switches 1030 and 1032 may be connected at a node 4, and the signal at node 4 may be expressed by the logical expression $\overline{B \oplus C}$. Moreover, such a configuration of inverter

1024, inverter 1028, switch 1030, and switch 1032 may form a transfer gate logic XNOR gate, as shown in FIG. 9. In addition, such a transfer gate logic XNOR gate may form a first stage 1002 for inputs Bi and Ci.

Input Ci also may be connected to a source of a switch 1026. Input Ci also may be connected to inverter 1028, which may be connected to a source of a switch 1029. Input Bi of compressor 1000 may be connected to a n-gate of switch 1029 and a p-gate of switch 1026. Moreover, input Bi also may be connected to inverter 1024, which may be connected to a negate of switch 1026 and a p-gate of switch 1029. The outputs or drains of switches 1026 and 1029 may be connected at a node 3, and the signal at node 3 may be expressed by the logical expression $Bi \oplus Ci$. Moreover, such a configuration of inverter 1024, inverter 1028, switch 1026, and switch 1029 may form a transfer gate logic XOR gate. In addition, such a transfer gate logic XOR gate may form another first stage 1002 for inputs Bi and Ci.

In above-described embodiment of the present invention, inputs Ai and Bi only are connected to gates of switches in each of their respective first stages. Similarly, inputs Ci and Di only are connected to sources of switches in each of their respective first stages.

Moreover, to implement the above-described logical expressions, the output of inverter 1008 also may be connected to a source of switch 1034, and the output of inverter 1024 may be connected to a source of switch 1036. In addition, the XNOR output from node 4 may be connected to a p-gate of switch 1034 and a n-gate of switch 1036, and the XOR output from node 3 may be connected to a p-gate of switch 1036 and a n-gate of switch 1034. The outputs or drains from switches 1034 and 1036 may be connected at a node 5. The signal at node 5 may be logically expressed as $\overline{Di} \cdot (Bi \oplus Ci) + \overline{Bi} \cdot \overline{(Bi \oplus Ci)}$. Node 5 then may be connected to an inverter 1038 to generate first carry bit output Xo, which may be logically expressed as $Xo = (Bi \oplus Ci) \cdot Di + \overline{(Bi \oplus Ci)} \cdot Bi$. In one embodiment, Xo then may be connected to carry bit input Xi of the successive compressor 1000. Alternatively, Xo may be connected to one of the inputs Ai–Di of successive compressor 1000. Moreover, switch 1034, switch 1036, and inverter 1038 may form a second logic stage for each of inputs Bi, Ci, and Di.

In addition, the output of inverter 1022 may be connected to a source of a switch 1040, such that the drain of switches 1018 and 1020 are not connected to the source of switch 1040. Similarly, the output of inverter 1014 may be connected to a source of a switch 1042, such that the drain of switches 1010 and 1012 are not connected to the source of switch 1042. The output at node 4 may be connected to a n-gate of switch 1040 and a p-gate of switch 1042. Similarly, the output at node 3 may be connected to a n-gate of switch 1042 and a p-gate of switch 1040. The outputs or drains from switches 1040 and 1042 may be connected at a node 6. The signal at node 6 may be logically expressed as $((Ai \oplus Di) \oplus (Bi \oplus Ci))$. In addition, switches 1040 and 1042 may form a second logic stage for input Ai, and also may form an alternative second logic stage for each of inputs Bi, Ci, and Di.

Moreover, the output of inverter 1014 may be connected to a source of a switch 1044, such that the drain of switches 1010 and 1012 are not connected to the source of switch 1044. Similarly, the output of inverter 1022 may be connected to a source of a switch 1046, such that the drain of switches 1018 and 1020 are not connected to the source of switch 1046. The output at node 4 may be connected to a n-gate of switch 1044 and a p-gate of switch 1046. Similarly, the output at node 3 may be connected to a n-gate of switch 1046 and a p-gate of switch 1044. The outputs or drains from switches 1044 and 1046 may be connected at a node 7. The signal at node 7 may be logically expressed as $\overline{((Ai \oplus Di) \oplus ((Bi \oplus Ci)))}$. In addition, switches 1044 and 1046 may form an alternative second logic stage for input Ai, and also may form yet another alternative second logic stage for each of inputs Bi, Ci, and Di.

Carry bit input Xi may be connected to a source of a switch 1058, and also may be connected to an inverter 1054, which may be connected to a source of switch 1056. In one embodiment, carry bit input Xi may be the first carry bit output Xo from the previous compressor 1000. Moreover, the output at node 7 may be connected to a n-gate of switch 1056 and a p-gate of switch 1058, and the output at node 6 may be connected to a n-gate of switch 1058 and a p-gate of switch 1056. The outputs or drains from switches 1056 and 1058 may be connected at a node 8. Node 8 may be connected to an inverter 1060 to form summation output So, which may be logically expressed as $So = ((Bi \oplus Ci) \oplus (Di \oplus Ai)) \oplus Xi$. Inverter 1054, switch 1056, switch 1058, and inverter 1060 may form a third logic stage for each of inputs Ai, Bi, Ci, and Di.

Inverter 1054 also may be connected to a source of a switch 1048, and inverter 1016 may be connected to a source of a switch 1050. The output at node 6 may be connected to a n-gate of switch 1048 and a p-gate of switch 1050, and the output at node 7 may be connected to a n-gate of switch 1050 and a p-gate of switch 1048. The outputs or drains from switches 1048 and 1050 may be connected at a node 9. Node 9 may be connected to an inverter 1052 to form second carry bit output Co, which may be logically expressed as $Co = ((Bi \oplus Ci) \oplus (Di \oplus Ai)) \cdot Xi + \overline{((Bi \oplus Ci) \oplus (Di \oplus A))} \cdot Ai$. In addition, switch 1048, switch 1050, and inverter 1052 may form an alternative third logic stage for each of inputs Ai, Bi, Ci, and Di.

As described above, compressor 1000 may include logic stages 1002, 1004, and 1006, which may be XOR or XNOR stages. Compressor 1000 also may include a plurality of transistor paths between each of the inputs and each of the outputs. A path may be defined as the electrical route over which a particular input signal must travel in order to reach a particular output. For example, in order to reach output So, input signal Bi may flow through inverter 1024, switch 1026, switch 1040, switch 1058, and inverter 1060. Thus, for this particular path (1), input signal Bi flows through five transistor gates, such that the "transistor stage level" for path (1) is five. Moreover, input signal Bi also flows through logic stage 1002, which for path (1) comprises switch 1026 and inverter 1024, logic stage 1004, which for path (1) comprises switch 1040, and logic stage 1006, which for this path comprises switch 1058 and inverter 1060. As such, the "logic stage level" for path (1) is three. However, in order to reach output So input signal Bi also may flow through switch 1032, switch 1046, switch 1056, and inverter 1060. Thus for this particular path (2), although the path stage number also is three, input signal Bi only flows through four transistor gates, such that the transistor stage level for path (2) is four.

In addition, input signal Di may flow through inverter 1008, switch 1012, inverter 1014, switch 1044, switch 1056, and inverter 1060. Thus for this particular path (3), the path stage number also is three. However, input signal Di flows through six transistor gates, such that the transistor stage level for path (3) is six. Similarly, input signal Ai may flow through inverter 1016, switch 1018, inverter 1022, switch 1046, switch 1056, and inverter 1060. Thus for this particular path (4), the path stage number also is three. Moreover, the transistor stage level for path (4) also is six. However, each of the inputs Ai, Bi, Ci, and Di, may have a path or multiple paths to at least one of the outputs, which may have different transistor stage levels.

A first compressor "critical transistor stage path" may be defined as the path having the greatest transistor stage level between an input and an output within first compressor 1000. Similarly, a first compressor "critical logic stage path" may be defined as the path having the greatest logic stage level between an input and an output within first compressor 1000. Decreasing the first compressor critical transistor stage path level may increase the speed of the multiplier. Similarly, decreasing the first compressor critical logic stage path level also may increase the speed of the multiplier. However, compressor 1000 may have a plurality of first compressor critical transistor stage paths and a plurality of first compressor critical logic stage paths, or alternatively, may have a single first compressor critical transistor stage path. For example, in compressor 1000, each of path (3) and path (4) is a first compressor critical transistor stage path and also is a first compressor critical logic stage path because for path (3) and path (4) the transistor stage level is six and the logic stage level is three, and no other paths between an input and an output have a greater transistor stage level or a greater logic stage level. Path (1) is not a first compressor critical transistor stage path because for path (1), the transistor stage level only is five, and as such, the transistor stage level for each of path (3) and path (4) is greater than the transistor stage level for path (1). However, path (1) is a first compressor critical logic stage path because the logic stage level for path (1) is three, and as such, the logic stage level for path (1) is the same as the logic stage level for each of path (3) and path (4).

In addition, first carry bit output Xo from first compressor 1000 may be connected to carry bit input Xi of successive compressor 1000 in a Wallace tree. Alternatively, first carry bit output Xo from first compressor 1000 may be connected to one of the plurality of inputs Ai–Di of successive compressor 1000. Consequently, in addition to having at least one first compressor critical logic stage path and at least one first compressor critical transistor stage path, each compressor 1000 also has at least one successive compressor critical transistor stage path and at least one successive compressor critical logic stage path. For example, in compressor 1000, carry bit output Xo may be defined by inputs Bi Ci, and Di. Input signal Bi may flow through inverter 1024, switch 1026, switch 1036, and inverter 1038. The first carry bit output Xo of first compressor 1000 then may be connected to the carry bit input of successive compressor 1000, such that carry bit input Xi may generate summation output So. For example, carry bit output Xo may flow through inverter 1054, switch 1056, and inverter 1060. This successive path (5) from Bi and Xo of first compressor 1000 to Xi and So of successive compressor 1000 has a transistor path level of seven. In addition, successive path (5) flows through stages 1002 and 1004 of first compressor 1000 and stages 1006 of successive compressor 1000. Consequently, successive path (5) has a logic stage level of three. Similarly, input signal Ci may flow through inverter 1028, switch 1030, switch 1036, and inverter 1038. The first carry bit output Xo of first compressor 1000 then may be connected to the carry bit input Xi of successive compressor 1000, such that carry bit input Xi may generate summation output So. For example, carry bit output Xo may flow through inverter 1054, switch 1056, and inverter 1060. This successive path (6) from Ci and Xo of first compressor 1000 to Xi and So of successive compressor 1000 also has a transistor path level of seven. In addition, successive path (6) flows through stages 1002 and 1004 of first compressor 1000 and stage 1006 of successive compressor 1000. Consequently, successive path (6) has a logic stage level of three. However, input signal Di may flow through inverter 1008, switch 1034, and inverter 1038. The first carry bit output Xo of first compressor 1000 then may be connected to the carry bit input Xi of successive compressor 1000, such that carry bit input Xi may generate summation output So. For example, carry bit output Xo may flow through inverter 1054, switch 1056, and inverter 1060. This successive path (7) from Di and Xo of first compressor 1000 to Xi and So of successive compressor 1000 has a transistor path level of six. In addition, successive path (7) flows through stages 1002 and 1004 of first compressor 1000 and stage 1006 of successive compressor 1000. Consequently, successive path (7) has a logic stage level of three.

A successive compressor "critical transistor stage path" may be defined as the path having the greatest transistor stage level from one of the inputs of first compressor 1000 to first compressor 1000 carry bit output Xo and further to successive compressor 1000 summation output So or second carry bit output Co. Similarly, a successive compressor "critical logic stage path" may be defined as the path having the greatest logic stage level from one of the inputs of first compressor 1000 to first compressor 1000 carry bit output Xo and further to successive compressor 1000 summation output So or second carry bit output Co. Decreasing the successive compressor critical transistor stage path level may increase the speed of the multiplier. Similarly, decreasing the successive compressor critical logic stage path level also may increase the speed of the multiplier. However, each compressor 1000 may have a plurality of successive compressor critical transistor stage paths and a plurality of successive compressor critical logic stage paths, or alternatively, may have a single successive compressor critical transistor stage path. For example, in compressor 1000, each of successive path (5) and successive path (6) is a successive compressor critical transistor stage path and also is a successive compressor critical logic stage path because for each of successive path (5) and successive path (6), the transistor stage level is seven and the logic stage level is three. However, successive path (7) is not a successive compressor critical transistor stage path because the for successive path (7) the transistor stage level only is six. However, successive path (7) is a successive compressor critical logic stage path because the logic stage level is three.

Consequently, for compressor 1000 according to the embodiment of the present invention shown in FIG. 10, the first compressor critical transistor stage path level is six, the successive compressor critical transistor stage path level is seven, the first compressor critical logic stage path level is three, and the successive compressor critical logic stage path level is three.

Moreover, the output of any inverter in compressor 1000 only may drive either a gate or a source of any switch within the same logic stage as the inverter. For example, inverter 1008 drives the source of switches 1012 and 1018, but may not drive any gate of any switches within logic stage 1002. Similarly, inverter 1016 drives the gate of switches 1010, 1012, 1018, and 1020, but may not drive any source of any switches within logic stage 1002. In addition, inverter 1028 drives the source of switches 1029 and 1030, but may not drive any gates of any switches within logic stage 1002. Similarly, inverter 1024 drives the gate of switches 1026, 1029, 1030, and 1032, but may not drive any source of any switches within logic stage 1002. Moreover, inverter 1054 drives the source of switches 1056 and 1048, but may not drive any gate of any switches within logic stage 1006.

In addition, a drain of a switch may not drive the source of another switch. For example, the drain of switches 1026 and 1029 may be connected at node 3 and may drive the gate of switches 1034, 1036, 1040, 1042, 1044, and 1046, respectively. Similarly, the drain of switches 1030 and 1032 may be connected at node 4 and also may drive the gate of switches 1034, 1036, 1040, 1042, 1044, and 1046, respectively. Moreover, the drain of switches 1010 and 1012 may not drive any gates or any sources of switches because the drain of switches 1010 and 1012 are connected at node 1, which is connected to inverter 1014. As such, inverter 1014 is a buffer between the drain of switches 1010 and 1012 and the source of any other switches. In addition, the drain of switches 1040 and 1042 may be connected at node 6 and may drive the gate of switches 1048, 1050, 1056, and 1058. Similarly, the drain of switches 1044 and 1046 may be connected at node 7 and may drive the gate of switches 1048, 1050, 1056, and 1058.

Moreover, each of the inputs Ai, Bi, Ci, and Di, may not drive both the source and the gate of a switch. For example, input Ai may drive the gate of switches 1010, 1012, 1018, and 1020, respectively, while inverter 1016 which is connected to input Ai may drive the source of switch 1050. Similarly, input Di may drive the source of switches 1010 and 1020, respectively, while inverter 1008 which is connected to input Di may drive the source of switches 1012, 1018, and 1034. However, input Ai only drives the gate of any switch and input Di only drives the source of any switch.

Figure 11:
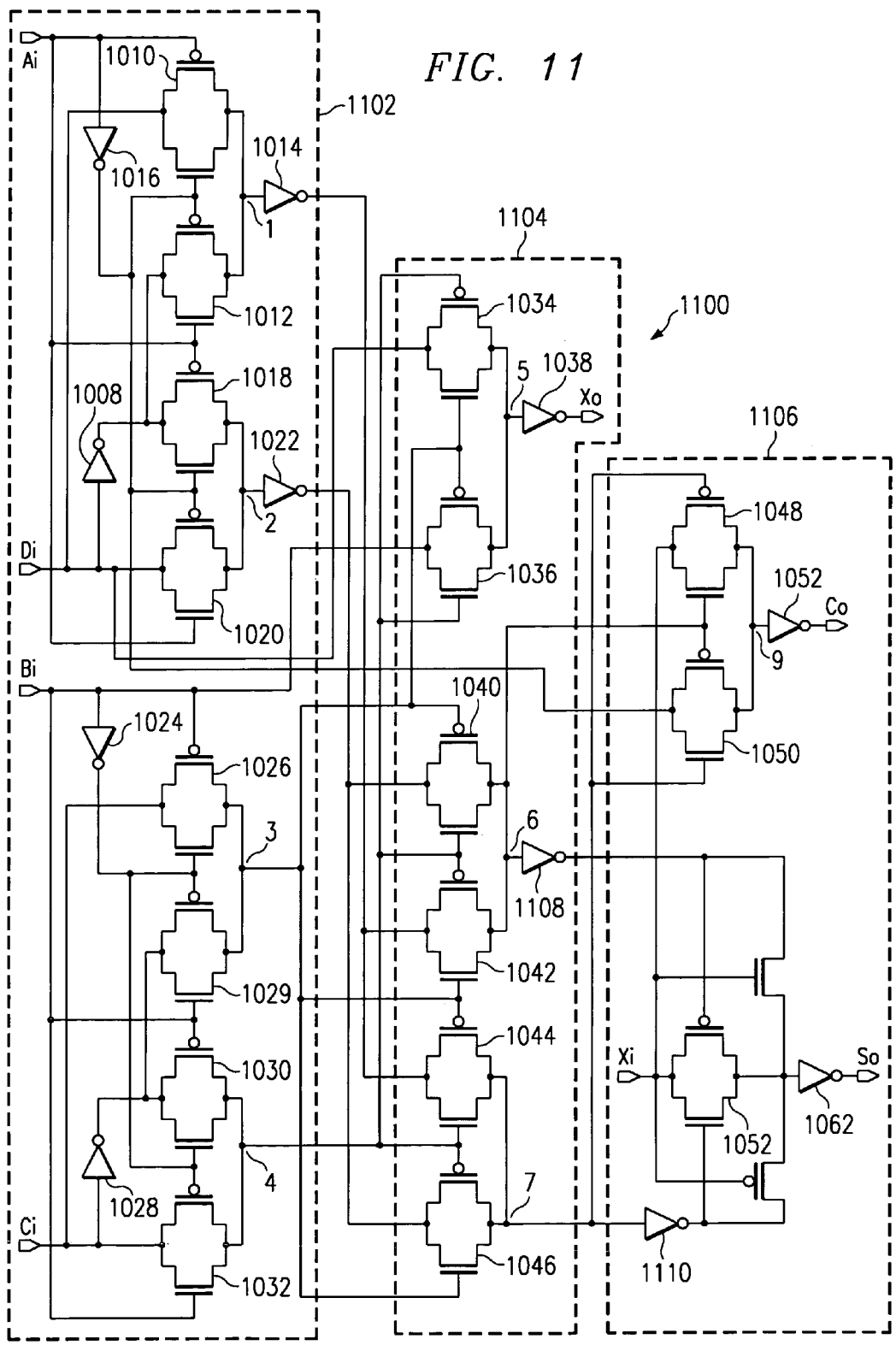
FIG. 11 is a schematic of a 4-2 compressor employing transfer gate logic XOR gates and transfer gate logic XNOR gates according to an embodiment of the present invention.

Referring to FIG. 11, a compressor 1100 employing transfer gate logic XOR gates, transfer gate logic XNOR gates, and at least one pass transistor logic XOR gate is described. Compressor 1100 also may comprise the plurality of inputs, Ai, Bi, Ci, and Di, which may be bit products from partial products to be summed from a Booth encoder circuit (not shown). Compressor 1100 also may comprise carry bit input Xi, summation output So, first output carry bit Co, and second output carry bit Xo. Moreover, first carry bit output Xo of a first compressor 1100 also may be connected to carry bit input Xi of a successive compressor 1100 to generate summation output So and second carry bit output Co of the successive compressor 1000. Moreover, compressor 1100 also is designed to implement the following logical expressions:

$$So = ((Bi \oplus Ci) \oplus (Di \oplus Ai)) \oplus \overline{Xi}; \quad (1)$$

$$Co = ((Bi \oplus Ci) \oplus (Di \oplus Ai)) \cdot Xi + \overline{((Bi \oplus Ci) \oplus (Di \oplus Ai))} \cdot Ai; \text{ and} \quad (2)$$

$$Xo = (Bi \oplus Ci) \cdot \overline{Di} + \overline{(Bi \oplus Ci)} \cdot \overline{Bi}. \quad (3)$$

Compressor 1100 may be substantially similar to compressor 1000. The differences between this embodiment of the present invention and the embodiment shown in FIG. 10 are discussed below.

Figure 1:
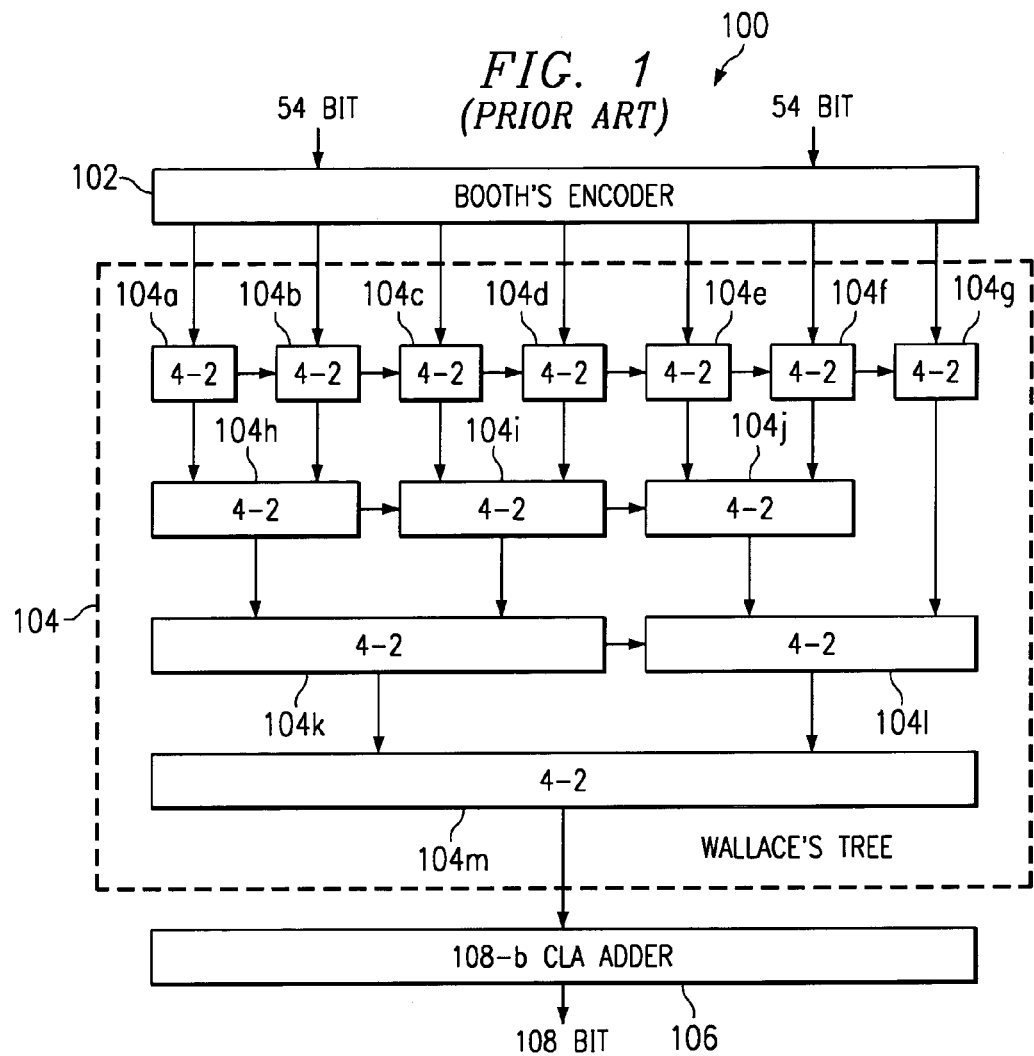
FIG. 1 is a flow chart of a known 54-bit multiplier.
Figure 8A:
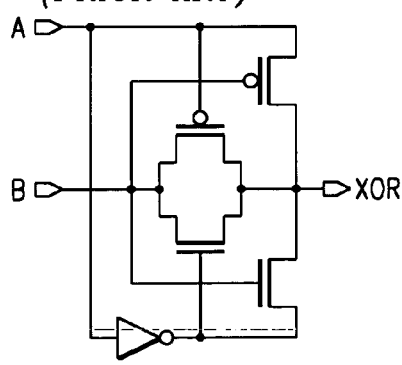
FIG. 8a is a schematic of a known pass transistor logic XOR gate.
Figure 8B:
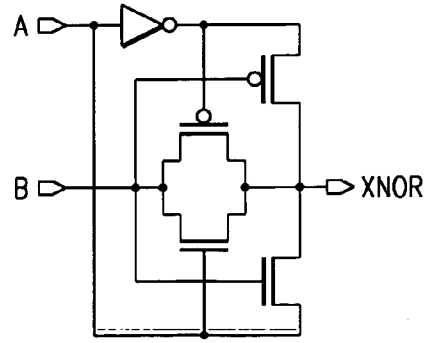
FIG. 8b is a schematic of a known pass transistor logic XNOR gate.
Figure 2:
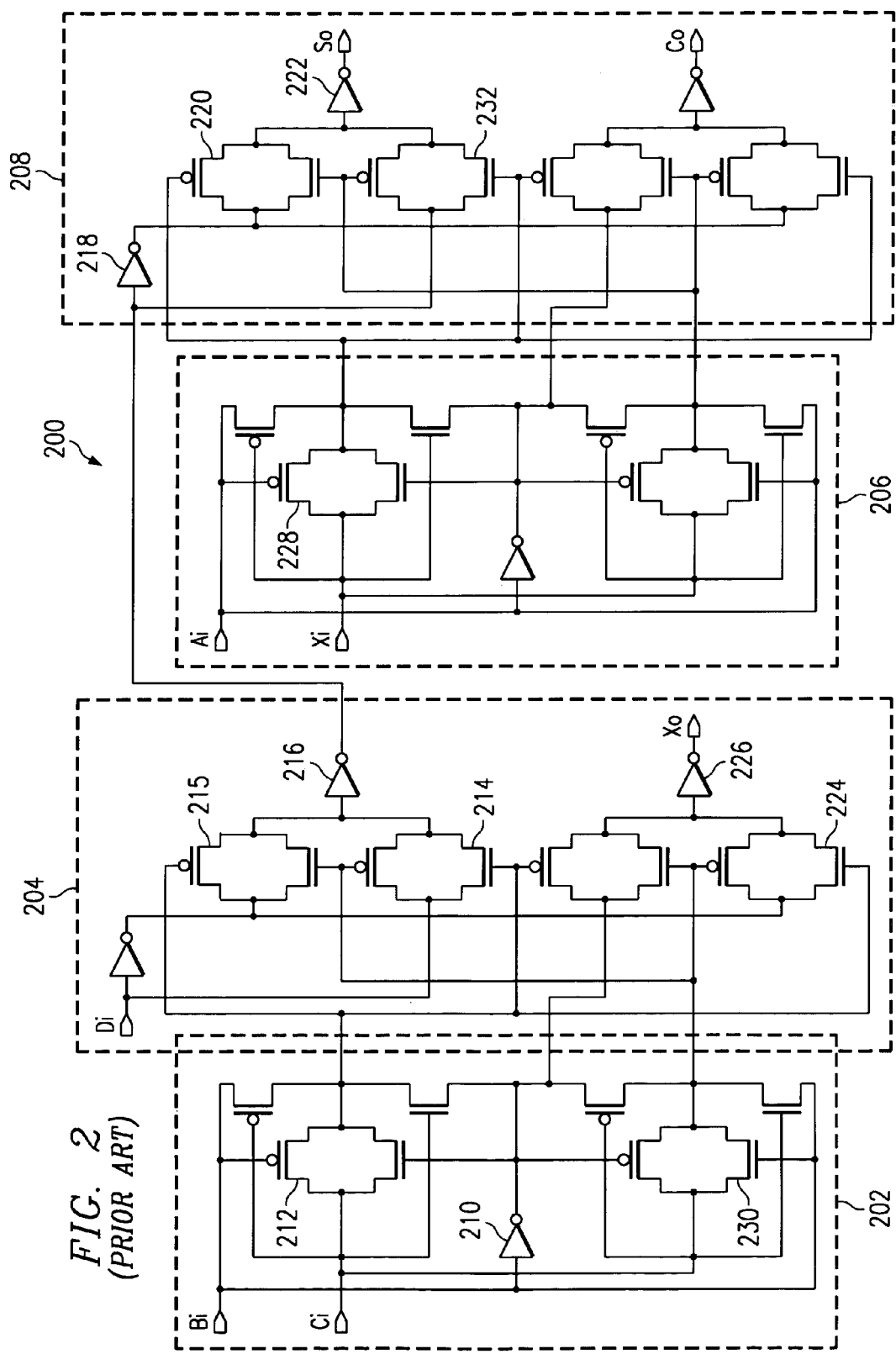
FIG. 2 is a schematic of a known 4-2 compressor employing a combination of pass transistor logic XOR gates, pass transistor XNOR gates, transfer gate logic XOR gates, and transfer gate logic XNOR gates.
Figure 3:
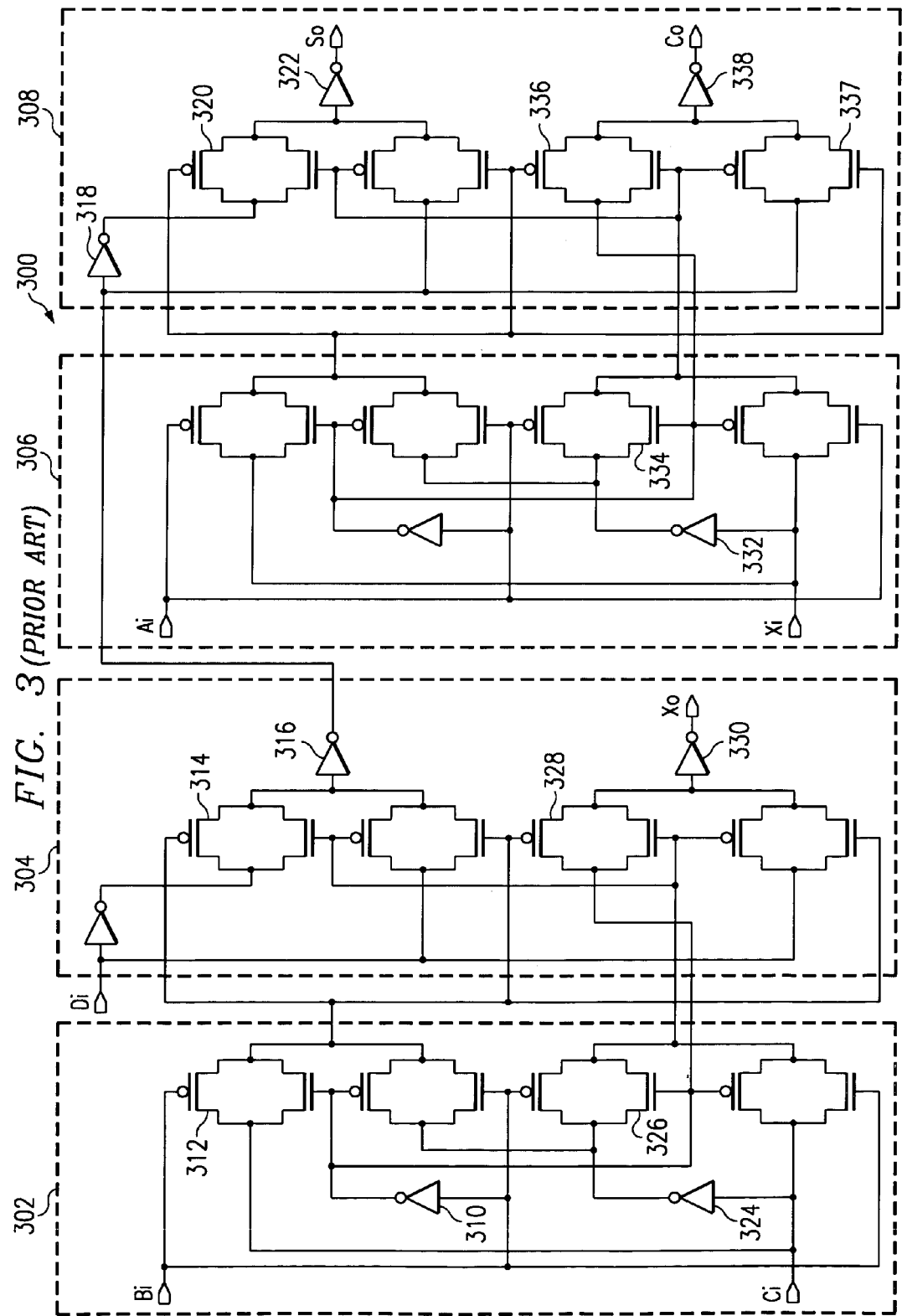
FIG. 3 is a schematic of a known 4-2 compressor employing transfer gate logic XOR gates and transfer gate logic XNOR gates.
Figure 4:
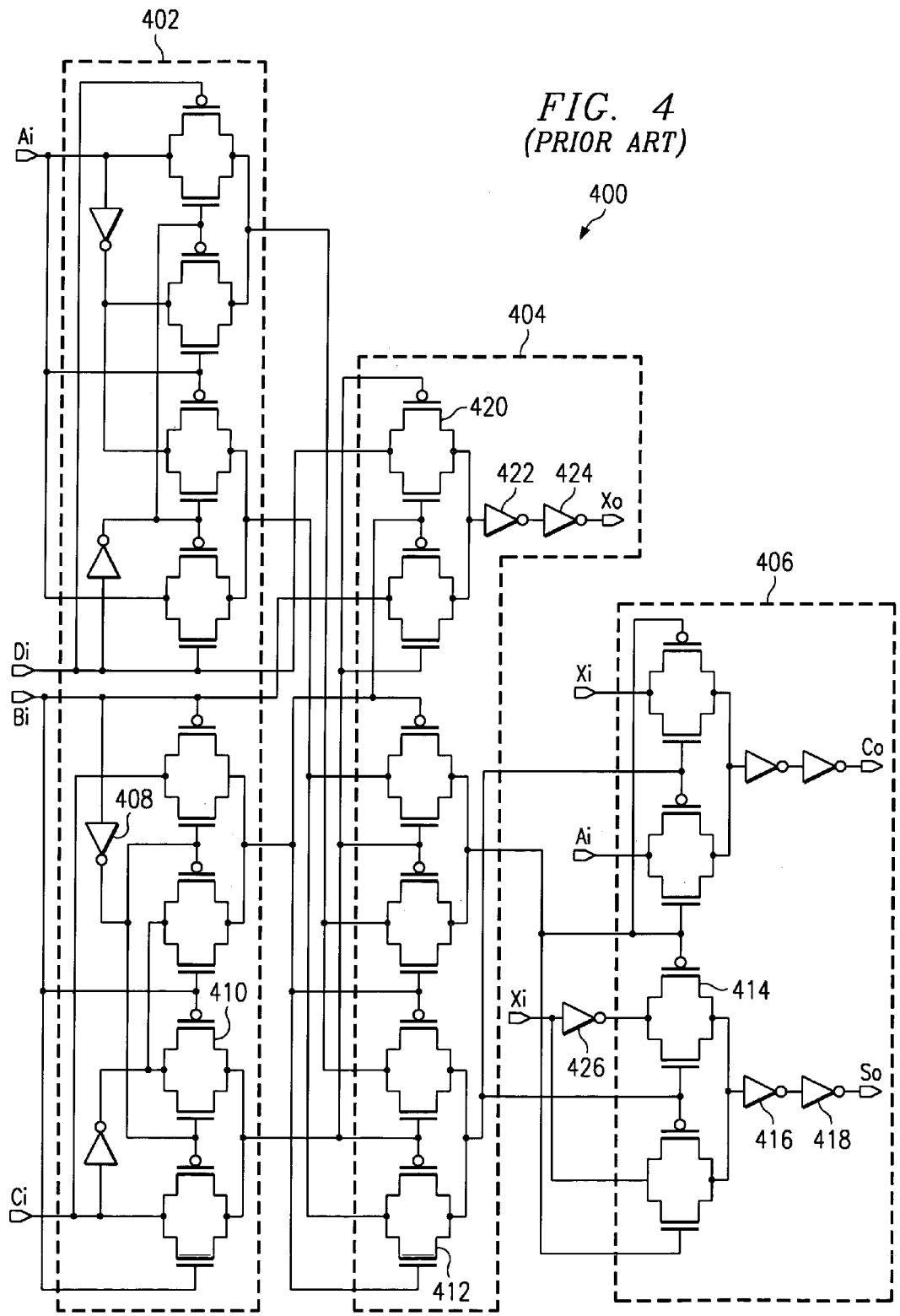
FIG. 4 is a schematic of a known 4-2 compressor employing transfer gate logic XOR gates and transfer gate logic XNOR gates.
Figure 5:
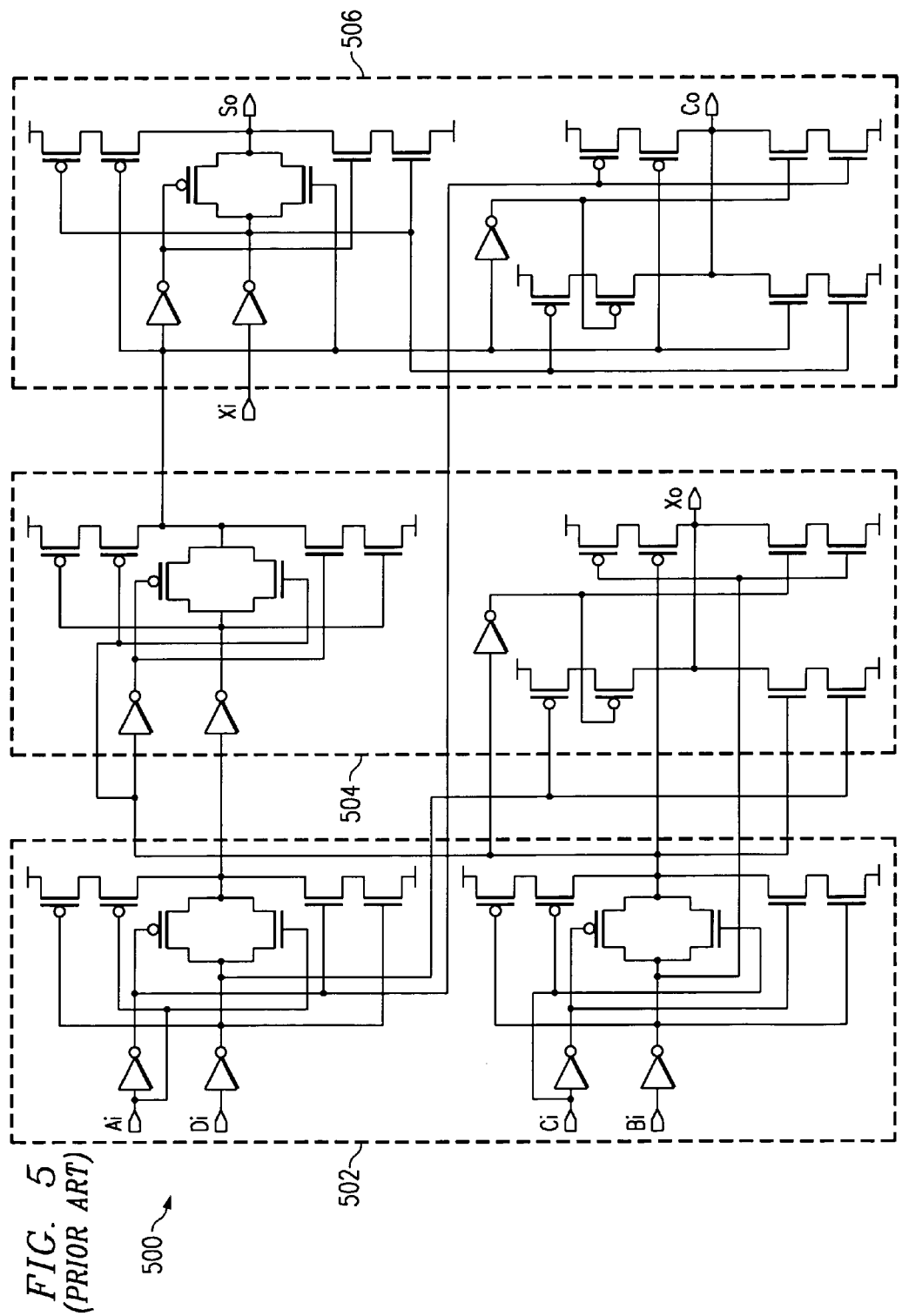
FIG. 5 is a schematic of a known 4-2 compressor employing a tri-state buffer configuration.
Figure 6:
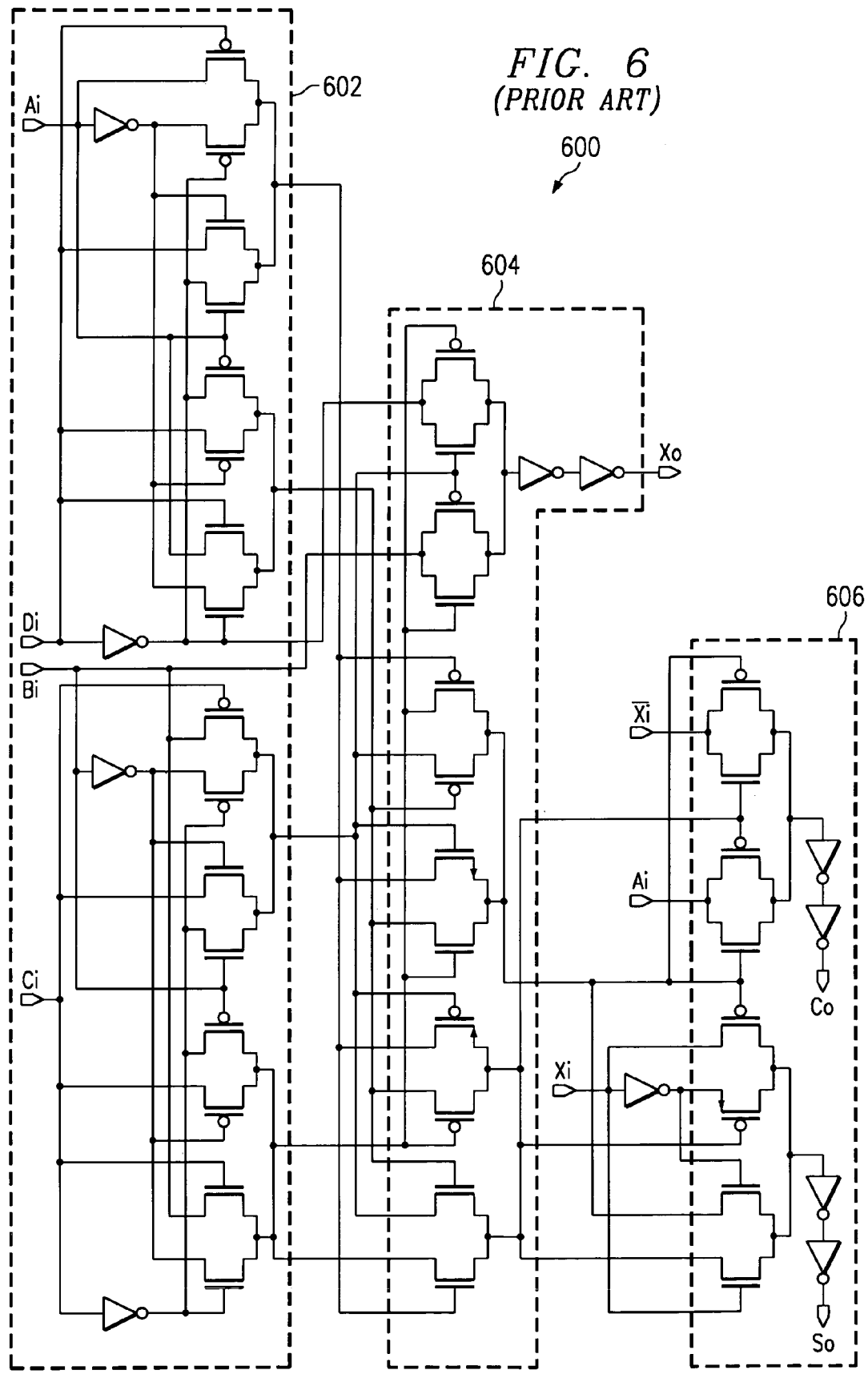
FIG. 6 is a schematic of a known 4-2 compressor employing transfer gate logic XOR gates and transfer gate logic XNOR gates.

To implement these logical expressions, input Di, rather than inverter 1008, may be connected to the source of switch 1034. Similarly, input Bi, rather than inverter 1024, may be connected to the source of switch 1036. Moreover, input Xi, rather than inverter 1054, may be connected to the source of switch 1048, and compressor 1100 may not comprise inverter 1054. Instead, compressor 1100 may comprise an inverter 1108 connected to node 6 and an inverter 1110 connected to node 7. Moreover, inverter 1110 may be connected to an n-gate of switch 1052, inverter 1108 may be connected to a p-gate of switch 1052, and input Xi may be connected to the source of switch 1052, such that inverter 1108, 1110, and switch 1052 may form a pass transistor logic XOR gate as shown in FIG. 8a. The drain of switch 1052 may be connected to inverter 1062 to generate summation output So.

In compressor 1100, input signal Ai may flow through inverter 1016, switch 1010, inverter 1014, switch 1044, inverter 1110, switch 1052, and inverter 1062. Thus, the transistor path level for this path (8) is seven. Moreover, because no paths in compressor 1100 have a first compressor transistor level greater than seven, path (8) also is a first compressor critical transistor stage path. In compressor 1100, input signal Bi may flow through inverter 1024, switch 1026, switch 1036, and inverter 1038, to generate first carry bit output Xo. When carry bit output Xo is connected to carry bit input signal Xi, input signal Xi may flow through switch 1052 and inverter 1062. Thus, the transistor path level for this successive path (9) is six. Moreover, because no paths in compressor 1100 have a successive compressor transistor level greater than six, successive path (9) also is a successive compressor critical transistor stage path.

For compressor 1100 according to the embodiment of the present invention shown in FIG. 11, the first compressor critical transistor stage path level is seven, the successive compressor critical transistor stage path level is six, the first compressor critical logic stage path level is three, and the successive compressor critical logic stage path level is three.

While the invention has been described in connecting with preferred embodiments, it will be understood by those of ordinary skill in the art that other variations and modifications of the preferred embodiments described above may be made without departing from the scope of the invention. Other embodiments will be apparent to those of ordinary skill in the art from a consideration of the specification or practice of the invention disclosed herein.

What we claim is:

1. A compressor of a multiplier comprising:
    a first compressor, wherein said first compressor comprises:
        a first plurality of inputs;
        a first summation output;
        a first carry bit output;
        a first plurality of transistor paths connecting each of said first plurality of inputs to said summation output, wherein a first compressor critical transistor stage path level within said first compressor is less than seven;
        a second carry bit output;
        a second plurality of transistor paths connecting each of said first plurality of inputs to said second carry bit output; and
    a successive compressor, wherein said successive compressor comprises:
        a second plurality of inputs;
        a second summation output; and
    said compressor of a multiplier further comprising:
        a plurality of successive transistor paths connecting at least one of said first plurality of inputs to said first carry bit output of said first compressor, connecting said first carry bit output to at least one of said second plurality of inputs between said first compressor and said second compressor and connecting at least one of the second plurality of inputs to said second summation output of said successive compressor, wherein a successive compressor critical transistor stage path level within said successive compressor is less than eight;
    wherein each of said first plurality of transistor paths, each of said second plurality of transistor paths, and each of said plurality of successive transistor paths comprises a plurality of switches and a plurality of inverters;

wherein said switches and said inverters form a plurality of logic stages for each of said first plurality of inputs; and wherein a first compressor critical logic stage path level is three within said first compressor and a successive compressor critical logic stage path level is three within said successive compressor.

2. The compressor of claim 1, wherein at least one of said logic stages for at least one of said first plurality of inputs is a transfer gate XOR stage and at least one of said logic stages for at least one of said first plurality of inputs is a transfer gate XNOR stage.

3. The compressor of claim 1, wherein when one of said first plurality of inputs is connected to a source of one said switches, said input is not connected to a gate of another of said switches, and when one of said first plurality of inputs is connected to a gate of one said switches, said input is not connected to a source of another of said switches.

4. The compressor of claim 1, wherein a drain of each of said switches is not connected to a source of another of said switches.

5. The compressor of claim 1, wherein when one of said inverters within one of said logic stages is connected to a source of one of said switches within the same logic stage as said inverter, said inverter is not connected to a gate of another of said switches within the same logic stage as said inverter, and when one of said inverters within one of said logic stages is connected to a gate of one of said switches within the same logic stage as said inverter, said inverter is not connected to a source of another of said switches within the same logic stage as said inverter.

6. The compressor of claim 1, wherein a first compressor critical logic stage path level is less than four and a successive compressor critical logic stage path level is less than four.

7. The compressor of claim 1, wherein a number of binary ones in the first plurality of inputs is the sum of two times the first carry bit output, two times the second carry bit output, and the summation output.

8. The compressor of claim 7, wherein the summation output, the second carry bit output, and the first carry bit output, are logically expressed as $So = ((Bi \oplus Ci) \oplus (Di \oplus Ai)) \oplus Xi;$ $Co = ((Bi \oplus Ci) \oplus (Di \oplus Ai)) \cdot Xi + \overline{((Bi \oplus Ci) \oplus (Di \oplus Ai))} \cdot Ai;$ and $Xo = (Bi \oplus Ci) \cdot Di + \overline{(Bi \oplus Ci)} \cdot Bi.$ 9. A compressor of a multiplier comprising:
a first compressor, wherein said first compressor comprises:
a first plurality of inputs;
a first summation output;
a first carry bit output;
a first plurality of transistor paths connecting each of said first plurality of inputs to said summation output, wherein a first compressor critical transistor stage path level within said first compressor is less than seven;
a second carry bit output;
a second plurality of transistor paths connecting each of said first plurality of inputs to said second carry bit output; and
a successive compressor, wherein said successive compressor comprises:
a second plurality of inputs;
a second summation output; and
said compressor of a multiplier further comprising:
a plurality of successive transistor paths connecting at least one of said first plurality of inputs to said first carry bit output of said first compressor, connecting said first carry bit output to at least one of said second plurality of inputs between said first compressor and said second compressor and connecting at least one of the second plurality of inputs to said second summation output of said successive compressor, wherein said first compressor critical transistor stage path level within said first compressor is six and said successive compressor critical transistor stage path level within said successive compressor is seven.

10. The compressor of claim 9, wherein a number of said first plurality of inputs is five.

* * * * *